United States Patent
Dmitriev et al.

(10) Patent No.: US 6,955,719 B2
(45) Date of Patent: *Oct. 18, 2005

(54) MANUFACTURING METHODS FOR SEMICONDUCTOR DEVICES WITH MULTIPLE III-V MATERIAL LAYERS

(75) Inventors: Vladimir A. Dmitriev, Gaithersburg, MD (US); Denis V. Tsvetkov, Gaithersburg, MD (US); Aleksei Pechnikov, North Potomac, MD (US); Yuri V. Melnik, Rockville, MD (US); Aleksandr Usikov, Silver Spring, MD (US); Oleg Kovalenkov, Gaithersburg, MD (US)

(73) Assignee: Technologies and Devices, Inc., Silver Springs, MD (US)

(*) Notice: Subject to any disclaimer, the term of this patent is extended or adjusted under 35 U.S.C. 154(b) by 99 days.

This patent is subject to a terminal disclaimer.

(21) Appl. No.: 10/623,375

(22) Filed: Jul. 18, 2003

(65) Prior Publication Data

US 2004/0137657 A1 Jul. 15, 2004

Related U.S. Application Data (63) Continuation of application No. 10/113,692, filed on Mar. 28, 2002, now Pat. No. 6,660,083.
(60) Provisional application No. 60/280,604, filed on Mar. 30, 2001, provisional application No. 60/283,743, filed on Apr. 13, 2001, and provisional application No. 60/398,176, filed on Jul. 24, 2002.

(51) Int. Cl.$^7$ ............................................. C30B 25/00
(52) U.S. Cl. ........................ 117/91; 117/84; 117/88; 117/89; 117/99; 117/98; 117/107; 117/952
(58) Field of Search ........................ 117/91, 84, 88, 117/89, 98, 99, 107, 952, 94, 104

(56) References Cited

U.S. PATENT DOCUMENTS

| | | | |
|---|---|---|---|
| 3,836,408 A | 9/1974 | Kasano | 117/99 |
| 3,865,655 A | 2/1975 | Pankove | 438/565 |
| 4,190,470 A | 2/1980 | Walline | 117/86 |
| 4,268,842 A | 5/1981 | Jacob et al. | 257/76 |
| 4,419,179 A | 12/1983 | Nogami | 117/102 |
| 5,074,954 A | 12/1991 | Nishizawa | 118/719 |
| 5,322,592 A | 6/1994 | Beckers et al. | 117/80 |
| 5,334,250 A | 8/1994 | Mikami et al. | 118/724 |
| 5,679,152 A | 10/1997 | Tischler et al. | 117/97 |
| 5,770,887 A | 6/1998 | Tadatomo et al. | 257/613 |

(Continued)

FOREIGN PATENT DOCUMENTS

| | | | |
|---|---|---|---|
| JP | 54-112790 | 9/1979 | H01L/21/20 |
| JP | 60-250619 | 12/1985 | H01L/21/20 |
| JP | 07-045538 | 2/1995 | H01L/21/20 |

*Primary Examiner*—Robert Kunemund
*Assistant Examiner*—Matt J. Song
(74) *Attorney, Agent, or Firm*—Bingham McCutchen LLP

(57) ABSTRACT

A method for fabricating semiconductor devices with thin (e.g., submicron) and/or thick (e.g., between 1 micron and 100 microns thick) Group III nitride layers during a single epitaxial run is provided, the layers exhibiting sharp layer-to-layer interfaces. According to one aspect, an HVPE reactor is provided that includes one or more gas inlet tubes adjacent to the growth zone, thus allowing fine control of the delivery of reactive gases to the substrate surface. According to another aspect, an HVPE reactor is provided that includes at least one growth zone as well as a growth interruption zone. According to another aspect, an HVPE reactor is provided that includes extended growth sources such as slow growth rate gallium source with a reduced gallium surface area. According to another aspect, an HVPE reactor is provided that includes multiple sources of the same material, for example Mg, which can be used sequentially to prolong a growth cycle.

34 Claims, 3 Drawing Sheets

U.S. PATENT DOCUMENTS

| | | | |
|---|---|---|---|
| 5,875,769 A | 3/1999 | Toyama et al. | 125/16.01 |
| 5,935,321 A | 8/1999 | Chiou et al. | 117/13 |
| 5,993,542 A | 11/1999 | Yanashima et al. | 117/84 |
| 6,006,738 A | 12/1999 | Itoh et al. | 125/21 |
| 6,056,817 A | 5/2000 | Uchida et al. | 117/4 |
| 6,110,290 A | 8/2000 | Maeda | 118/725 |
| 6,110,809 A | 8/2000 | Sze et al. | 438/503 |
| 6,113,985 A | 9/2000 | Suscavage et al. | 427/255.39 |
| 6,136,093 A | 10/2000 | Shiomi et al. | 117/4 |
| 6,139,631 A | 10/2000 | Kato | 117/200 |
| 6,146,457 A | 11/2000 | Solomon | 117/90 |
| 6,156,581 A * | 12/2000 | Vaudo et al. | 438/22 |
| 6,177,292 B1 | 1/2001 | Hong et al. | 438/46 |
| 6,177,688 B1 | 1/2001 | Linthicum et al. | 257/77 |
| 6,218,280 B1 | 4/2001 | Kryliouk et al. | 438/607 |
| 6,337,102 B1 | 1/2002 | Forrest et al. | 427/64 |
| 6,406,540 B1 | 6/2002 | Harris et al. | 117/104 |
| 6,472,300 B2 | 10/2002 | Nikolaev et al. | 438/509 |
| 6,476,420 B2 | 11/2002 | Nikolaev et al. | 257/82 |
| 6,573,164 B2 * | 6/2003 | Tsvetkov et al. | 438/507 |
| 6,576,054 B1 * | 6/2003 | Melnik et al. | 117/91 |
| 6,613,143 B1 * | 9/2003 | Melnik et al. | 117/84 |
| 6,656,272 B2 * | 12/2003 | Tsvetkov et al. | 117/104 |
| 6,660,083 B2 * | 12/2003 | Tsvetkov et al. | 117/99 |
| 2002/0028565 A1 | 3/2002 | Nikolaev et al. | 438/478 |
| 2002/0155713 A1 | 10/2002 | Tsetkov et al. | 438/689 |
| 2002/0174833 A1 | 11/2002 | Tsetkov et al. | 118/724 |

* cited by examiner

MANUFACTURING METHODS FOR SEMICONDUCTOR DEVICES WITH MULTIPLE III-V MATERIAL LAYERS

CROSS-REFERENCES TO RELATED APPLICATIONS

This application claims the benefit of U.S. Provisional Patent Application Ser. No. 60/398,176 filed Jul. 24, 2002 and priority from and is a continuation of U.S. patent application Ser. No. 10/113,692 filed Mar. 28, 2002 now U.S. Pat. No. 6,660,083 claiming the benefit of U.S. Provisional Patent Application Ser. Nos. 60/280,604 filed Mar. 30, 2001 and 60/283,743 filed Apr. 13, 2001, and priority from U.S. patent application Ser. No. 10/355,426 filed Jan. 31, 2003 which is a continuation-in-part of U.S. patent application Ser. No. 09/900,833 filed Jul. 6, 2001, and priority from U.S. patent application Ser. No. 09/903,299 filed Jul. 11, 2001 which is a continuation of U.S. patent application Ser. No. 09/900,833 filed Jul. 6, 2001, the disclosures of which are incorporated herein by reference for all purposes.

FIELD OF THE INVENTION

The present invention relates generally to semiconductor devices and, more particularly, to a method and apparatus for fabricating semiconductor devices with p-type material layers of Group III nitride materials.

BACKGROUND OF THE INVENTION

III–V compounds such as GaN, AlN, AlGaN, InGaN, InAlGaN, and InGaAlBNPAs have unique physical and electronic properties that make them ideal candidates for a variety of electronic and opto-electronic devices. In particular, these materials exhibit a direct band gap structure, high electric field breakdown, and high thermal conductivity. Additionally, materials such as $In_xAl_{1-x}GaN$ can be used to cover a wide range of band gap energies, i.e., from 1.9 eV (where x equals 1) to 6.2 eV (where x equals 0).

Until recently, the primary method used to grow Group III nitride semiconductors was metal organic chemical vapor deposition (MOCVD) although other techniques such as molecular beam epitaxy (MBE) have also been investigated. In the MOCVD technique, III–V compounds are grown from the vapor phase using metal organic gases as sources of the Group III metals. For example, typically trimethylaluminum (TMA) is used as the aluminum source and trimethylgallium (TMG) is used as the gallium source. Ammonia is usually used as the nitrogen source. In order to control the electrical conductivity of the grown material, electrically active impurities are introduced into the reaction chamber during material growth. Undoped III–V compounds normally exhibit n-type conductivity, the value of the n-type conductivity being controlled by the introduction of a silicon impurity in the form of silane gas into the reaction chamber during growth. In order to obtain p-type material using this technique, a magnesium impurity in the form of biscyclopentadienymagnesium is introduced into the reactor chamber during the growth cycle. As Mg doped material grown by MOCVD is highly resistive, a high temperature post-growth anneal in a nitrogen atmosphere is required in order to activate the p-type conductivity.

Although the MOCVD technique has proven adequate for a variety of commercial devices, the process has a number of limitations that constrain its usefulness. First, due to the complexity of the various sources (e.g., trimethylaluminum, trimethylgallium, and biscyclopentiadienylmagnesium), the process can be very expensive and one which requires relatively complex equipment. Second, the MOCVD technique does not provide for a growth rate of greater than a few microns per hour, thus requiring long growth runs. The slow growth rate is especially problematic for device structures that require thick layers such as high voltage rectifier diodes that often have a base region thickness of approximately 30 microns. Third, n-type AlGaN layers grown by MOCVD are insulating if the concentration of AlN is high (>50 mol. %). Accordingly, the concentration of AlN in the III–V compound layers forming the p-n junction is limited. Fourth, in order to grow a high-quality III–V compound material on a substrate, the MOCVD technique typically requires the growth of a low temperature buffer layer in-between the substrate and III–V compound layer. Fifth, generally in order to obtain p-type III–V material using MOCVD techniques, a post-growth annealing step is required.

Hydride vapor phase epitaxy or HVPE is another technique that has been investigated for use in the fabrication of III–V compound materials. This technique offers advantages in growth rate, simplicity and cost as well as the ability to grow a III–V compound layer directly onto a substrate without the inclusion of a low temperature buffer layer. In this technique III–V compounds are epitaxially grown on heated substrates. The metals comprising the III–V layers are transported as gaseous metal halides to the reaction zone of the HVPE reactor. Accordingly, gallium and aluminum metals are used as source materials. Due to the high growth rates associated with this technique (i.e., up to 100 microns per hour), thick III–V compound layers can be grown.

The HVPE method is convenient for mass production of semiconductor devices due to its low cost, flexibility of growth conditions, and good reproducibility. Recently, significant progress has been achieved in HVPE growth of III–V compound semiconductor materials. AlGaN, GaN and AlN layers have been grown as well as a variety of structures using this technique. Since this technique does not require low temperature buffer layers, a variety of novel device structures have been fabricated, such as diodes with n-GaN/p-SiC heterojunctions. Furthermore, p-type layers have recently been produced using HVPE, thus allowing p-n or p-i-n junction devices to be fabricated.

In order to fully utilize HVPE in the development and fabrication of III–V compound semiconductor devices, thin layers must be produced, on the order of a micron or less. Conventional HVPE techniques have been unable, however, to grow such layers. As a result, the potential of the HVPE technique for fabricating devices based on Group III semiconductors has been limited.

Accordingly, what is needed in the art is a method and apparatus for growing both submicron and thick Group III nitride compounds using HVPE techniques in multiple layers of the desired thickness can be grown during a single epitaxial run. The present invention provides such a method and apparatus.

SUMMARY OF THE INVENTION

The present invention provides a method for fabricating semiconductor devices with multiple thin and/or thick Group III nitride layers, the layers exhibiting sharp layer-to-layer interfaces.

According to one aspect of the invention, a method for fabricating multi-layer Group III nitride semiconductor devices in a single reactor run utilizing HVPE techniques is provided, wherein the layers can be either thin (e.g., submicron) or thick (e.g., greater than 1 micron and preferably less than 100 microns). Preferably an atmospheric, hot-walled horizontal furnace is used. Sources (Group III metals, Group V materials, acceptor impurities, donor impurities) are located within the multiple source zones of the furnace, the sources used being dependent upon the desired compositions of the individual layers. Preferably HCl is used to form the necessary halide metal compounds and an inert gas such as argon is used to transport the halide metal compounds to the growth zone where they react with ammonia gas. As a result of the reaction, epitaxial growth of the desired composition occurs. By controlling the inclusion of one or more acceptor and/or donor impurities, the conductivity of each layer can be controlled.

In at least one embodiment of the invention, the reactor includes one or more gas inlet tubes adjacent to the growth zone. By directing the flow of a gas (e.g., an inert gas) generally in the direction of the substrate's surface and/or in a direction opposite to or in an oblique angle to that the of the gas flow from the source tubes, the epitaxial growth rate can be reduced or completely disrupted.

In at least one embodiment of the invention, the reactor includes multiple growth zones. Preferably the reactor also includes at least one growth interruption zone. One or more gas inlet tubes direct a flow of gas (e.g., an inert gas) towards the growth interruption zone, thereby substantially preventing any reactive gases from entering into this zone. In use, after the growth of a layer is completed, the substrate is transferred from the growth zone to either the growth interruption zone or to another growth zone. Preferably the temperature of the substrate is maintained during the transfer as well as when the substrate is within the growth interruption zone, thus preventing thermal shock. If the reactor includes a single growth zone, the substrate is transferred to the growth interruption zone so that the growth zone can be purged and the sources required for the next desired layer can be delivered to the growth zone. Preferably the substrate is never transferred to a new growth zone, or from the growth interruption zone to the single growth zone, until the reaction in the intended growth zone has stabilized.

Depending upon the thickness of a particular layer, the reactor of the invention may utilize either extended growth sources (e.g., a slow growth rate gallium source with a reduced gallium surface area) and/or multiple sources of the same material (e.g., Mg) that can be used sequentially to prolong a growth cycle.

A further understanding of the nature and advantages of the present invention may be realized by reference to the remaining portions of the specification and the drawings.

DESCRIPTION OF THE SPECIFIC EMBODIMENTS

The present invention provides a method for producing multi-layer semiconductor devices comprised of thick layers of III–V compounds on the order of 1 to 100 micrometers thick and/or submicron thin layers of III–V compounds. As a result of the ability to fabricate such layers within a single epitaxial run, the present invention allows a variety of device structures (e.g., bipolar devices, high power devices, high frequency devices, etc.) to be realized.

Processes

Figure 1:
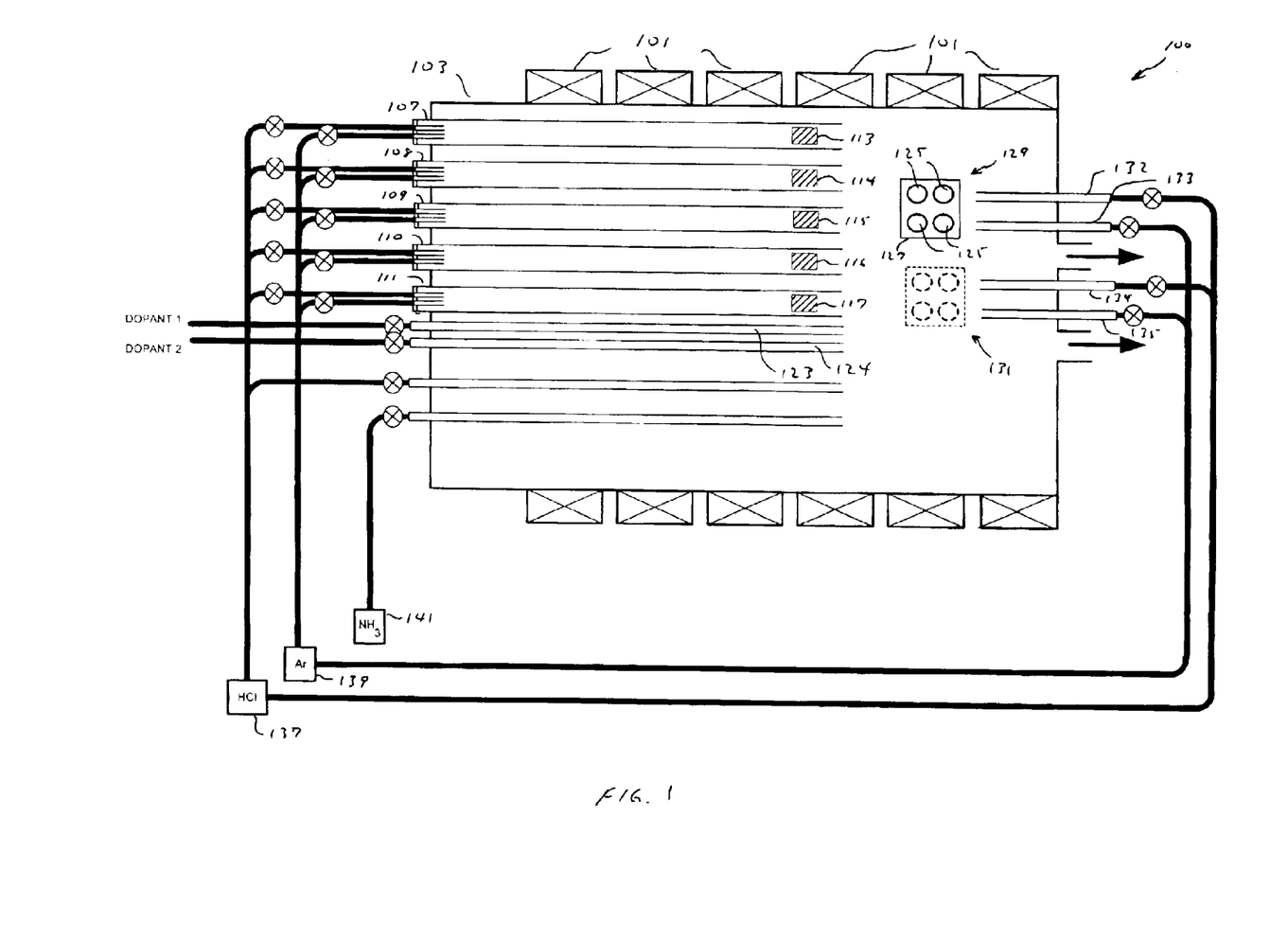
FIG. 1 is a schematic illustration of an atmospheric, hot-walled horizontal furnace as used with a preferred embodiment of the invention.

FIG. 1 is a schematic illustration of an atmospheric, hot-walled quartz horizontal furnace 100 as used with the preferred embodiment of the invention. It should be understood that the invention is not limited to this particular furnace configuration as other furnace configurations (e.g., vertical furnaces) that offer the required control over the temperature, temperature zones, gas flow, source location, substrate location, etc., can also be used. Furnace 100 is comprised of multiple temperature zones, preferably obtained by using multiple resistive heaters 101, each of which at least partially surrounds furnace tube 103. It is understood that although reactor tube 103 preferably has a cylindrical cross-section, other configurations can be used such as a 'tube' with a rectangular cross-section. Within reactor tube 103 are one or more source tubes. As noted with respect to reactor tube 103, although the source tubes preferably have a cylindrical cross-section, the invention is not limited to cylindrical source tubes. Additionally, although source tubes are used in the preferred embodiment of the invention, other means of separating the sources can be used, such as furnace partitions.

In the preferred embodiment shown in FIG. 1, five source tubes 107–111 are used, thus allowing the use of a metallic gallium (Ga, preferably 6N) source 113, an aluminum (Al, preferably 5N) source 114, an indium (In, preferably 5N) source 115, a boron (B) source 116, and a magnesium (Mg, preferably 4N) source 117. It is understood that both fewer and greater numbers of source tubes can be used, as well as different sources, depending upon the layers and structures that are to be fabricated.

Preferably each source is held within a source boat. As used herein, the term "boat" simply refers to a means of holding the source material. Therefore a source boat may simply be a portion of a tube with an outer diameter that is slightly smaller than the inner diameter of the corresponding source tube. Alternately, the source boat may be comprised of a portion of a tube with a pair of end portions. Alternately, the source boat may be comprised of a plate of suitable material that fits within the corresponding source tube. Alternately, source material can be held within a source tube without the use of a separate boat. Additionally, alternate boat configurations are known by those of skill in the art and clearly envisioned by the inventors.

Preferably each boat is coupled, either permanently or temporarily, to a control rod that allows the position, and thus the temperature, of each boat/source to be controlled within reactor 103. The control rods may be manually manipulated or coupled to a robotic positioning system.

In the preferred embodiment of the invention, one or more source tubes 123–124 are used to introduce gases and/or impurities used during the growth process to achieve the desired composition for a specific layer.

One or more substrates 125 are located within the growth zone of reactor 103, the substrates preferably resting on a pedestal 127. If desired, pedestal 127 can be tilted relative to the gas flow direction, preferably with a tilt angle of between 5 and 15 degrees.

Typically multiple substrates 125 are loaded into the reactor for co-processing, although a single substrate can be processed with the invention. Substrates 125 are preferably comprised of sapphire ($Al_2O_3$) or silicon carbide (SiC, preferably 6H) although other suitable single crystal materials can be used with the invention (e.g., silicon (Si), gallium nitride (GaN), etc.). In at least one embodiment of the invention a 4 inch diameter substrate is used although it will be appreciated that other substrate sizes (e.g., 2 inch diameter, 6 inch diameter, etc.) can be used with the invention. Preferably if SiC is used as the substrate, the nitride-based structures are deposited on the (0001) Si face of the on-oriented wafer. Preferably if sapphire is used as the substrate, the nitride-based structures are deposited on the C-plane of the wafer.

In the preferred embodiment of the invention, reactor 103 includes multiple growth zones and substrate(s) 125 can be remotely and quickly repositioned during structure growth between the various growth zones. As shown, pedestal 127 is within a growth zone 129 while a second growth zone 131 is shown in phantom. It will be appreciated that these growth zones are shown for illustration purposes only and that other growth/non-growth zones can be located elsewhere within reactor 103, for example at distances further away from the source tubes thus allowing growth to be quickly and easily terminated. The inclusion of multiple growth zones as well as the ability to move substrate(s) 125 between zones allows the growth rate to be controllably varied, including the rapid initiation and/or termination of the growth of a particular layer. It will be appreciated that in order to minimize thermal shock while moving the substrate(s) between zones, preferably the temperature of the substrate(s) while passing between zones varies by less than 200° C., more preferably by less than 100° C., still more preferably by less than 50° C., still more preferably by less than 10° C., still more preferably by less than 5° C., and yet still more preferably by less than 1° C. Preferably substrate pedestal 127 is coupled to a robotic arm, thus allowing remote, rapid, and accurate repositioning of the substrate(s). Robotic systems are well known and will therefore not be described in further detail herein. In an alternate embodiment of the invention, substrate pedestal 127 is manually controlled. Additionally, the temperature of a particular region of the growth zone can be varied by altering the amount of heat applied by heaters 101 that are proximate to the growth zone region in question.

In addition to the previously noted source and impurity tubes, in the preferred embodiment of the invention at least one, and preferably more, additional gas inlet tubes 132–135 are located such that the gas flow passing through these tubes can be used to offset the flow of gas passing through the source tubes within specific growth zones, thus allowing growth rate to be controlled (e.g., reduced or terminated) and sharp layer interfaces to be achieved. Preferably one or more inert gases (e.g., Ar, $N_2$, etc.) and/or a halide gas (e.g., HCl) pass through tubes 132–135. The additional gas tubes can be configured to direct gas flow directly at the substrate's surface, parallel to the substrate's surface but in a direction opposite that of the gas flow from the source tubes, parallel to the substrate's surface but in an oblique angle to that of the gas flow from the source tubes, or in an oblique angle to the surface. Although a single gas inlet tube can be used per growth region, preferably multiple gas inlet tubes are directed at a single growth region at one or more angles, thus allowing fine control of the gas flow, and hence the material growth rate, within the region. If desired, gas inlet tubes 132–135 can be located adjacent to a non-growth region. The combination of the gas from tubes 132–135 and the movement of the substrate(s) from the growth region allow material growth to be abruptly terminated.

Although those of skill in the art know the general techniques for HVPE processing, examples of the HVPE process of the invention as well as exemplary structures are provided below. HVPE in general, and the reactor design and process of the current invention in particular, are applicable to many different compositions. Accordingly, it should be understood that the examples provided below are only intended to illustrate HVPE and the disclosed method of obtaining low growth rates, and that different layer compositions and conductivities can be obtained without departing from the invention.

Initially reactor 100 is purged with Ar gas, preferably for a few hours and at a flow rate in the range of 1 to 25 liters per minute, prior to the initiation of material growth. Substrate(s) 125 is placed in the desired growth zone (e.g., 129) and heated to the preferred growth temperature, for example a temperature of between 900° and 1050° C. for GaN growth. Preferably prior to initiating growth, the surface of substrate 125 is etched to remove residual surface contamination, for example using gaseous HCl from supply 137, preferably for at least 3 minutes. In at least one embodiment, after etching with HCl, substrate(s) 125 is subjected to gaseous aluminum chloride, preferably for at least 30 seconds, and more preferably for at least 5 minutes. The surface etching step can be performed at the growth temperature. Ga source material 113 is heated, preferably to a temperature of 650° to 1050° C., and more preferably to a temperature of between 650° and 850° C., after which gaseous HCl from source 137 is introduced into source tube 107. HCl flow for the Ga source as well as all other sources is preferably controlled to be within the range of 100 sccm to 1 sccm. As a result of the reaction between the HCl and the Ga, gallium chloride is formed. The gallium chloride is delivered to growth zone 129 by the flow of Ar gas from Ar gas source 139 through source tube 107. Simultaneously, ammonia gas from source 141 is delivered to growth zone 129 where the ammonia gas reacts with the gallium chloride to initiate the epitaxial growth of GaN. A growth rate of between 0.01 and 0.1 microns per hour is achieved, the growth rate controlled by the HCl and Ar flow rates and the temperature of the Ga source.

Although the above example illustrated the HVPE growth process for GaN, other Group III nitride layers can be grown. For example, utilizing Al source 114 in addition to Ga source 113, AlGaN layers of the desired conductivity (p-, n-, or i-type) can be grown within the growth zone. The process used to grow AlGaN layers is similar to the GaN process previously described. In this instance, in addition to heating the Ga source, the Al source is heated as well, typically to a temperature within the range of 700° to 850° C. Preferably the substrate temperature is maintained within the range of 1000° to 1150° C. during AlGaN growth. To grow an AlGaN layer, HCl gas 137 is introduced into Ga source tube 107 and Al source tube 108, resulting in the formation of gallium chloride and aluminum trichloride which is delivered to the growth zone by the flow of Ar gas 139. The reaction of ammonia gas 141 introduced into the growth zone simultaneously with the source materials results in the growth of AlGaN. Depending upon the concentration, if any, of acceptor impurities, the AlGaN layer may be n-, i-, or p-type.

Other Group III nitride layers that can be grown with the process of the invention include InGaN and InBAlGaN. Preferably these layers are grown at temperatures within the range of 750° to 900° C. and range of 800° to 1100° C., respectively. It will be appreciated that although the above examples illustrate the growth of the Group III nitride layer directly on the substrate, a buffer layer can be grown on the substrate prior to growing the desired Group III nitride layer.

If a p-type Group III nitride layer is desired, an appropriate acceptor impurity metal is introduced into the growth zone during the epitaxial growth phase. Although a variety of impurity metals can be used (e.g., Mg, Zn, MgZn, etc.), in the preferred embodiment of the invention Mg is used as the acceptor impurity metal. Additionally, the ratio of donors to acceptors can be further controlled by adding donor impurities to the Group III nitride layer as it is being grown. Suitable donor materials include, but are not limited to, oxygen (O), silicon (Si), germanium (Ge), and tin (Sn).

Assuming the use of Mg as the acceptor, Mg source 117 (metallic Mg) is heated to a temperature calibrated to provide the desired Mg atomic concentration in the resultant material. Typically the temperature of the Mg source is within the range of 450° to 700° C., preferably within the range of 550° to 650° C., and more preferably to a temperature of approximately 615° C. Prior to initiating growth, preferably the acceptor impurity metal is etched, for example using HCl gas for 5 minutes, thereby insuring minimal source contamination. Mg vapor from Mg source 117 is transferred to the growth zone (e.g., zone 129) using Ar gas (or a combination of Ar and HCl gases) flowing through source tube 111, the flow rate determining the Mg concentration. In at least one embodiment of the invention, after the desired p-type material has been growing for approximately 5 minutes, Mg source 117 is moved to a region of the reactor with a slightly lower temperature, typically approximately 10 degrees cooler, thereby reducing the Mg vapor pressure and minimizing defect formation. If the desired thickness of the p-type layer is sufficiently thick, the reactor may include multiple Mg sources that can be used serially in order to sustain a long growth run.

In addition to n-type and p-type Group III nitride layers, it is understood that insulating (i-type) Group III nitride layers can also be grown using the present invention. The process is similar to that described above, except that during growth of the material, fewer atoms of the acceptor impurity metal are delivered to the growth zone, thereby leading to a lower doping level. If required, donor impurities can be delivered to the growth zone as well.

In addition to thick Group III nitride layers, the present invention can be used to fabricate submicron layers (e.g., less than 1 micron, less than 0.1 microns, less than 0.01 microns, less than 0.005 microns) of the desired materials. In order to produce submicron layers, the growth rate was reduced down to approximately 0.01 microns per hour (and preferably down to approximately 0.005 microns per hour), this reduction being accomplished through the use of low gas flow rates and a modified growth process.

As previously noted, the growth rate and material characteristics of the desired Group III nitride layer can be controlled by the flow rate of HCl through the source tube(s), the temperature of the source(s), the concentration of impurities, and the flow rate/flow direction of the inert gases/HCl used to offset the flow of gases passing through the source tube(s). The inventors have found that controlling these parameters allows the growth of thick p-type Group III nitride layers with a thickness in the range of 5 to 10 microns, alternately within the range of 10 to 20 microns, alternately within the range of 15 to 20 microns, alternately within the range of 15 to 30 microns, alternately within the range of 20 to 30 microns, alternately within the range of 15 to 100 microns, alternately within the range of 10 to 100 microns, alternately within the range of 5 to 100 microns, or alternately within the range of 1 to 100 microns. The inventors have also found that controlling these parameters allows the growth of thin p-type Group III nitride layers with a thickness less than 1 micron, alternately less than 0.1 microns, or alternately less than 0.01 microns. The inventors have also found that controlling these parameters allows the growth of p-type Group III nitride layers with a standard deviation of layer thickness less than 10 percent, more preferably less than 5 percent, and still more preferably less than 1 percent. The inventors have also found that controlling these parameters allows the growth of p-type Group III nitride layers with a hole concentration at room temperature of between $1 \times 10^{18}$ cm$^{-3}$ to $1 \times 10^{19}$ cm$^{-3}$, alternately between $5 \times 10^{18}$ cm$^{-3}$ to $1 \times 10^{19}$ cm$^{-3}$, alternately between $5 \times 10^{18}$ cm$^{-3}$ to $5 \times 10^{19}$ cm$^{-3}$, alternately between $5 \times 10^{18}$ cm$^{-3}$ to $1 \times 10^{20}$ cm$^{-3}$, or alternately between $5 \times 10^{17}$ cm$^{-3}$ to $1 \times 10^{20}$ cm$^{-3}$. The inventors have also found that controlling these parameters allows the growth of p-type Group III nitride layers with an electrical resistivity at room temperature less than 1 Ohm cm, alternately less than 0.1 Ohm cm, or alternately less than 0.01 Ohm cm, with a standard deviation of electrical resistivity less than 10 percent. In order to increase electrical conductivity, preferably growth interruptions are introduced during a layer's growth, the growth interruptions lasting between 1 and 100 minutes during which preferably Ar and ammonia gases continue to flow. The inventors have also found that controlling these parameters allows a growth rate for the p-type Group III nitride layers of greater than 10 microns per hour, alternately greater than 20 microns per hour, or alternately greater than 40 microns per hour. The inventors have also found that controlling these parameters allows the growth of p-type Group III nitride layers with an Na—Nd concentration of between $1 \times 10^{18}$ cm$^{-3}$ and $1 \times 10^{20}$ cm$^{-3}$ or alternately than $1 \times 10^{1}$ cm$^{-3}$. The inventors have also found that controlling these parameters allows the growth of p-type Group III nitride layers with a full width at half maximum (FWHM) of the x-ray rocking curve measured in ω-scanning geometry for the (0002) reflection less than 800 arc seconds, preferably less than 600 arc seconds, and more preferably less than 400 arc seconds. The inventors have also found that controlling these parameters allows the growth of p-type AlGaN layers with an AlN concentration of between 35 and 55 molecular percent, alternately between 25 and 55 molecular percent, alternately between 15 and 55 molecular percent, alternately between 5 and 55 molecular percent, alternately between 5 and 75 molecular percent, or alternately between 1 and 90 molecular percent. The inventors have also found that controlling these parameters allows the growth of p-type Group III nitride layers with an acceptor impurity atomic concentration of between $5 \times 10^{19}$ cm$^{-3}$ and $5 \times 10^{20}$ cm$^{-3}$, alternately between $1 \times 10^{20}$ cm$^{-3}$ and $5 \times 10^{20}$ cm$^{-3}$, or alternately between $3 \times 10^{20}$ cm$^{-3}$ and $5 \times 10^{20}$ cm$^{-3}$. The inventors have also found that controlling these parameters allows a semiconductor device with a thick p-type Group III nitride layer to be fabricated which exhibits a low forward voltage drop, preferably less than 3 volts.

The inventors have found that controlling the growth parameters allows p-type Group III nitride layers to be formed with either a uniformly or non-uniformly distributed dislocation density, and with a dislocation density of less than $1\times10^9$ cm$^{-2}$, more preferably less than $1\times10^8$ cm$^{-2}$, still more preferably less than $1\times10^7$ cm$^{-2}$, and yet still more preferably less than $1\times10^6$ cm$^{-2}$. To improve the dislocation density, the inventors have determined that by temporarily halting the growth of a particular layer (e.g., p-type AlGaN), etching the growth surface to form etch pits corresponding to the dislocations, and then re-starting layer growth allows a continuous layer to be formed in which cavities are formed over the etch pits. The etching step is preferably performed using HCl gas for between 5 and 30 minutes at a substrate temperature of between 600 and 1100° C.

It will be appreciated that the disclosed invention can be used to fabricate a variety of different device structures. These structures can include structures in which a thick p-type layer of a Group III nitride (e.g., GaN, AlGaN, InGaN and InBAlGaN, etc.) is grown directly on a substrate (e.g., sapphire, silicon carbide, silicon, gallium nitride, etc.) or with a buffer layer interposed between the thick p-type layer and the substrate. A highly conducting n-type layer (e.g., GaN layer, AlGaN layer, AlGaInN layer, etc.) or other epitaxial structure (e.g., light emitting quantum well structure, etc.) can be grown directly on the thick p-type layer. Alternately, one or more layers can be interposed between the thick p-type layer and the epitaxial structure. If the thick p-type Group III nitride layer is doped with acceptor impurities, the impurities can be distributed uniformly or non-uniformly throughout the layer and if the latter, the concentration can be greater in the side of the layer adjacent to the substrate or greater in the side of the layer furthest from the substrate. Increasing the p-type doping at the layer's surface provides better carrier injection and/or lower contact resistance.

SPECIFIC EMBODIMENTS AND DEVICE STRUCTURE EXAMPLES

Embodiment I

A 4 inch sapphire substrate with a (0001) surface orientation was loaded into an HVPE reactor. The reactor and sources were prepared as noted above in preparation for the growth of a p-type GaN layer. A growth rate of 1 micron per minute was observed. After a total of fifteen minutes, the sample was removed from the growth zone. No cracks were visible in the resulting 15 micron thick p-type GaN layer which had a standard deviation in layer thickness across the entire wafer of less than 10 percent, a dislocation density of less than $10^9$ cm$^{-2}$ and an electrical resistivity of less than 5 ohm-cm. The Na—Nd concentration was $10^{19}$ cm$^{-3}$ and the FWHM of the x-ray rocking curve measured in ω-scanning geometry for the (0002) reflection was 550 arc seconds.

Embodiment II

Figure 2:
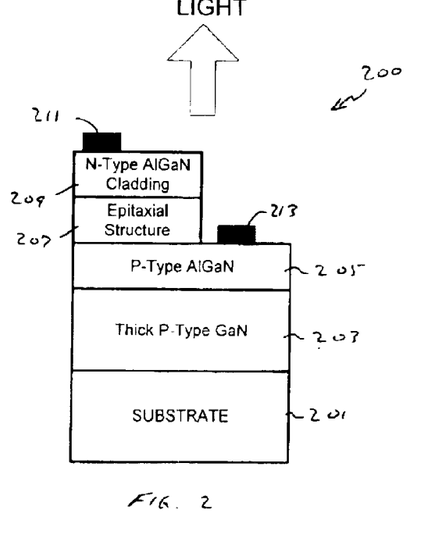
FIG. 2 illustrates an exemplary light emitting structure fabricated in accordance with the invention.

As illustrated in FIG. 2, a 4 inch sapphire substrate 201 with a (0001) surface orientation was loaded into an HVPE reactor and a 12 micron p-type GaN layer 203 with a Mg concentration of $3\times10^{20}$ cm$^{-3}$ was grown following the process described above. After GaN layer 203 was grown, substrate 201 was removed from the growth zone and aluminum trichloride was delivered to the growth zone. Gallium chloride and Mg vapor continued to be delivered to the growth zone. Substrate 201 was then reintroduced into the growth zone and a 0.3 micron thick p-type AlGaN layer 205 with an AlN concentration of 15 molecular percent and an Na—Nd concentration of $5\times10^{19}$ cm$^{-3}$ was grown. The substrate was removed from the growth zone after completion of the AlGaN layer. In a separate epitaxial process utilizing an additional source (i.e., indium), an n-type multiple quantum well InGaN structure 207 was grown on top of p-type AlGaN layer 205. After completion of the InGaN structure, an n-type AlGaN cladding layer 209 was grown, this layer serving as a contact layer for an n-type electrode 211 and a wide band gap window for light extraction. In addition to n-type electrode 211 formed on top of n-type AlGaN layer 209, an n-type electrode 213 was formed on p-type AlGaN layer 205 after reactor ion etching. Resultant structure 200 had a reduced forward voltage and improved light output.

Embodiment III

Figure 3:
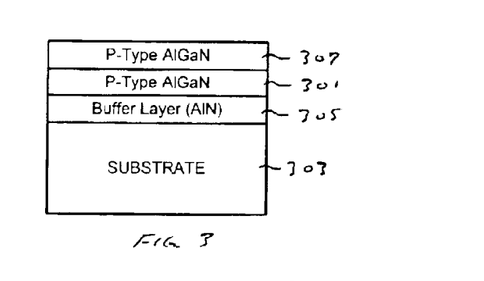
FIG. 3 illustrates an exemplary structure which includes a buffer layer interposed between the substrate and the thick p-type Group III nitride layer.

FIG. 3 illustrates another embodiment of the invention. In this embodiment a thick p-type AlGaN layer 301 was grown on a sapphire substrate 303. Layer 301 can be grown without misorientation from the (0001) plane, or with a small misorientation angle preferably in the range of 0 to 3 degrees and more preferably in the range of 0.5 to 3 degrees. The AlN concentration can be set between 0 and 60 molecular percent with an Na—Nd concentration preferably greater than $5\times10^{18}$ cm$^{-3}$, and more preferably greater than $1\times10^{19}$ cm$^{-3}$.

Although AlGaN layer 301 can be grown directly on substrate 303, in this embodiment an AlN buffer layer 305, preferably between 0.05 and 0.5 microns thick, is interposed between layer 301 and the substrate. Alternately, buffer layer 305 can be comprised of aluminum oxy nitride. Buffer layer 305 is formed after the substrate has been etched (e.g., treated with HCl and/or gaseous aluminum chloride for 5 to 20 minutes) using HVPE techniques in which layer 305 is formed by the reaction of sapphire substrate 303, HCl, ammonia, and the aluminum trichloride. During buffer formation, the temperature in the growth zone is between 500 and 1100° C., preferably between 1000 and 1050° C., the pressure is atmospheric and the growth cycle lasts between a few seconds and 30 minutes, depending upon the desired buffer thickness. The inventors have found that the addition of impurities such as Si, Mg, Zn and O may be introduced during the layer's growth to reduce stress and improve crystal quality.

Assuming that the desired device design is to include a second p-type AlGaN layer 307 on top of the first AlGaN layer 301, the inventors have found that a second AlN layer 309 interposed between the two AlGaN layers improves crystal quality and does not introduce additional electrical resistivity into the epitaxial structure. The second AlGaN layer 307 has a uniformly distributed dislocation density less than $1\times10^9$ cm$^{-2}$, preferably less than $1\times10^8$ cm$^{-2}$, and still more preferably less than $1\times10^7$ cm$^{-2}$ and a mobility greater than 10 cm$^2$ volt$^{-1}$ seconds$^{-1}$, alternately greater than 20 cm$^2$ volt$^{-1}$ second$^{-1}$, alternately greater than 30 cm$^2$ volt$^{-1}$ second$^{-1}$, or alternately greater than 50 cm$^2$ volt$^{-1}$ second$^{-1}$. The AlN concentration in layer 307 was between 0 and 80 molecular percent, with an Na—Nd concentration from $1\times10^{18}$ to $1\times10^{20}$ cm$^{-3}$. In the test sample, no cracks were observed in layer 307 although some cracks were observed in layer 301 using a UV microscope. These cracks were overgrown during the growth of layer 307. High Mg doping in the p-type AlGaN layers achieves a reduction in cracks and surface roughness.

A specific example of this embodiment was fabricated and characterized. The buffer layer was 0.5 microns thick, the first p-type AlGaN layer was 15 microns thick and the second p-type AlGaN layer was 0.5 microns thick. There was no second buffer interposed between the first and second AlGaN layers. The Na—Nd concentrations for the first and second AlGaN layers were $1\times10^{19}$ cm$^{-3}$ and $2\times10^{19}$ cm$^{-3}$, respectively. The dislocation density in the second layer was less than $1\times10^8$ cm$^{-2}$ and no cracks were observed in either of the layers. The interfaces were abrupt, the structure had a low total resistivity and the thickness and doping uniformity were better than 10 percent.

Embodiment IV

Figure 4:
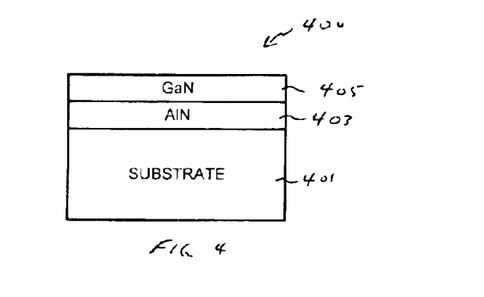
FIG. 4 illustrates an exemplary FET epitaxial structure.

Several FET epitaxial structures were grown in a single epitaxial run. An illustrative cross-section of these structures is shown in FIG. 4. For each device, substrate 401 was comprised of a 6H SiC wafer. The first layer was an AlN layer 403 grown directly on the substrate without any buffer layer. The growth rate for layer 403 was between 0.01 and 0.2 microns per minute, yielding a layer thickness for each of the devices of between 0.04 and 0.7 microns at a growth temperature of approximately 1050° C. A thin GaN layer 405 was grown on layer 403 also at a temperature of approximately 1050° C. The growth rate for layer 405 was between 0.05 and 0.3 microns per minute, yielding a layer 405 thickness for each of the devices of between 0.03 and 0.6 microns. Ni Schottky contacts with a diameter of 250 microns were evaporated onto the structure using electron beam evaporation techniques in order to study the electrical characteristics of the structures. Capacitance-voltage characteristics of the barriers were used to determine uncompensated donor concentration Nd—Na in the GaN layers. The Nd—Na concentration was determined to be approximately $10^{17}$ cm$^{-3}$. Although doped n+ contact layers were not intentionally grown, a higher Nd—Na concentration was noted at the GaN surface, probably due to the change of the III/V ratio on the growing surface at the end of the growth run.

Embodiment V

Figure 5:
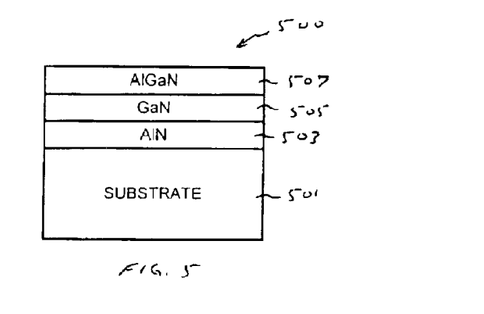
FIG. 5 illustrates a second exemplary FET epitaxial structure.

As in Embodiment IV, multiple FET epitaxial structures were grown in a single epitaxial run. An illustrative cross-section of these structures is shown in FIG. 5. For each device, substrate 501 was comprised of a 6H SiC wafer. The first layer was an AlN layer 503 grown directly on the substrate without any buffer layer. The growth rate for layer 503 was less than 0.1 microns per minute, yielding a layer thickness for each of the devices of between 0.05 and 0.4 microns at a growth temperature of approximately 1100° C. A thin GaN layer 505 was grown on layer 503 at a reduced temperature of approximately 1000° C. The growth rate for layer 505 was approximately 0.4 microns per minute, yielding a layer 505 thickness for each of the devices of between 0.01 and 0.15 microns. A thin AlGaN layer 507 was grown on layer 505 at a temperature of approximately 1000° C. The growth rate for layer 507 was between 0.05 and 0.3 microns per minute, yielding a layer 507 thickness for each of the devices of between 0.03 and 0.6 microns.

All of the epitaxial structures of Embodiment V had mirror-like surfaces. X-ray measurements were used to evaluate crystal quality and to measure AlN content in the AlGaN layer. The epitaxial layers exhibited a monocrystalline structure. The AlN content in the AlGaN layer estimated according to Vegard's law was equal to 38 molecular percent. GaN was not detected by x-ray, probably due to it's small layer thickness. Photoluminescent measurements revealed both AlGaN and GaN layers in the FET structure.

DEVICE STRUCTURE EXAMPLES

The following structures are merely illustrative of the types of devices that can be grown using the techniques of this invention. As previously noted, the devices can be grown using any of a variety of different substrates (e.g., SiC, Si, GaN, AlN, sapphire, GaAs, etc.). Unless specifically noted, the layers in the following structures can be either n-type (typically by doping the material during growth with Si or other donor impurities) or p-type (typically by doping the material during growth with Mg or other acceptor impurities).

Figure 6:
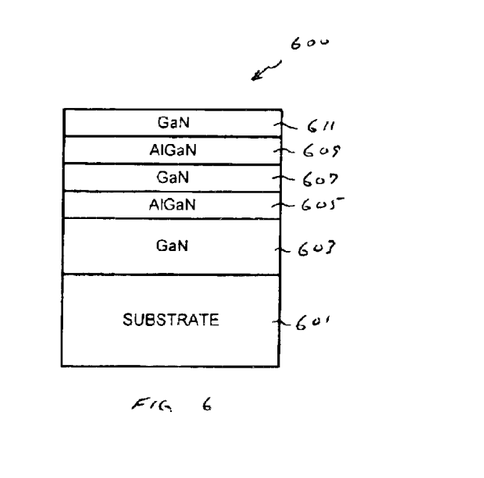
FIG. 6 illustrates an exemplary structure fabricated in accordance with the invention.

Structure 600 shown in FIG. 6 is comprised of a substrate 601, a thick GaN layer 603 (preferably on the order of 2 microns thick), a thin AlGaN layer 605 (preferably on the order of 0.1 microns thick), a thin GaN layer 607 (preferably on the order of 0.005 microns thick), a thin AlGaN layer 609 (preferably on the order of 0.1 microns thick), and a thin GaN layer 611 (preferably on the order of 0.2 microns thick).

Figure 7:
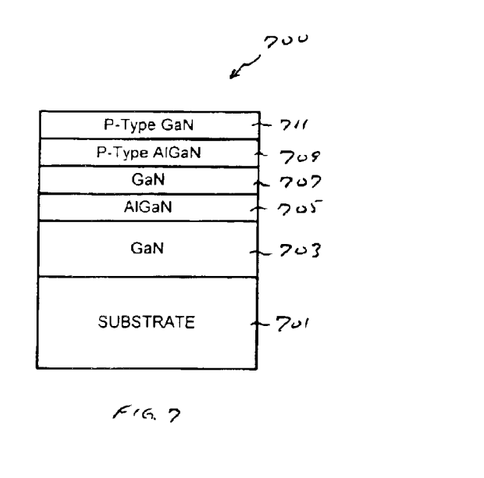
FIG. 7 illustrates a second exemplary structure fabricated in accordance with the invention.

Structure 700 shown in FIG. 7 has a device structure like that of structure 600, except that second AlGaN layer 709 and third GaN layer 711 are both p-type layers.

Figure 8:
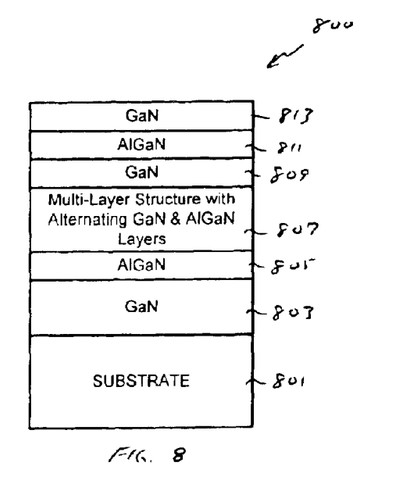
FIG. 8 illustrates a third exemplary structure fabricated in accordance with the invention.

Structure 800 shown in FIG. 8 is comprised of a substrate 801, a thick GaN layer 803 (preferably on the order of 2 microns thick), a thin AlGaN layer 805 (preferably on the order of 0.1 microns thick), a multi-layer structure 807, a thin GaN layer 809 (preferably on the order of 0.005 microns thick), a thin AlGaN layer 811 (preferably on the order of 0.1 microns thick), and a thin GaN layer 813 (preferably on the order of 0.2 microns thick). Multi-layer structure 807 is comprised of up to a 100 layers of alternating layers of GaN and AlGaN, where each individual layer is less than 0.05 microns thick.

Figure 9:
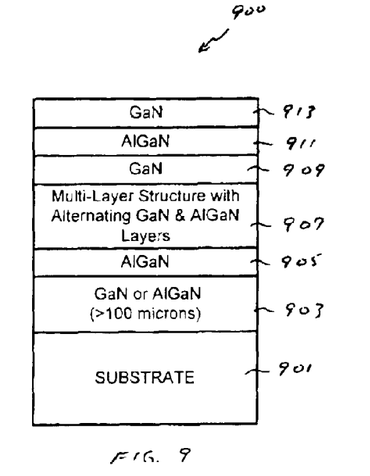
FIG. 9 illustrates a fourth exemplary structure fabricated in accordance with the invention.

Structure 900 shown in FIG. 9 has a device structure like that of structure 800, except that thick layer 903 can be comprised of either GaN or AlGaN, with a thickness in either case preferably greater than 100 microns.

Figure 10:
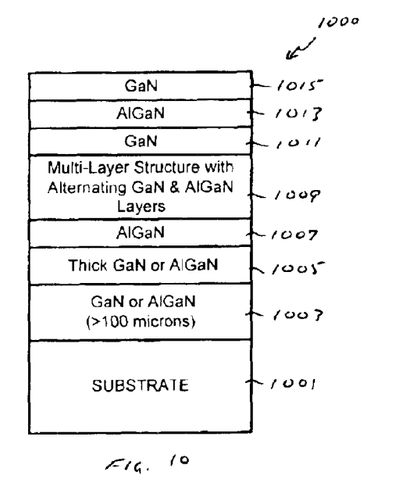
FIG. 10 illustrates a fifth exemplary structure fabricated in accordance with the invention.

Structure 1000 shown in FIG. 10 is comprised of a substrate 1001, a thick GaN or AlGaN layer 1003 (preferably greater than 100 microns thick), a second thick GaN, AlGaN or other Group III nitride layer 1005, a thin AlGaN layer 1007 (preferably on the order of 0.1 microns thick), a multi-layer structure 1009, a thin GaN layer 1011 (preferably on the order of 0.005 microns thick), a thin AlGaN layer 1013 (preferably on the order of 0.1 microns thick), and a thin GaN layer 1015 (preferably on the order of 0.2 microns thick). Multi-layer structure 1009 is comprised of up to a 100 layers of alternating layers of GaN and AlGaN, where each individual layer is less than 0.05 microns thick.

Figure 11:
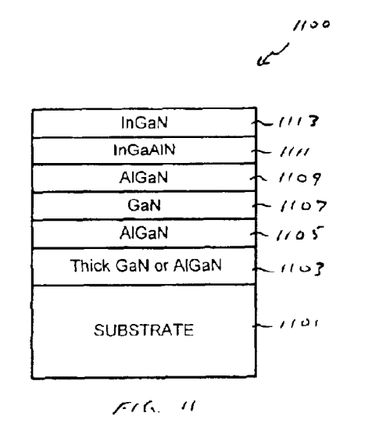
FIG. 11 illustrates a sixth exemplary structure fabricated in accordance with the invention.

Structure 1100 shown in FIG. 11 is comprised of a substrate 1101, a thick GaN or AlGaN layer 1103 (preferably greater than 100 microns thick), a thin AlGaN layer 1105 (preferably on the order of 0.05 microns thick), a thin GaN layer 1107 (preferably on the order of 0.002 microns thick), a thin AlGaN 1109 (preferably on the order of 0.05 microns thick), a thin InGaAlN layer 1111 (preferably on the order of 0.2 microns thick), and a thin InGaN layer 1113 (preferably on the order of 0.4 microns thick).

Figure 12:
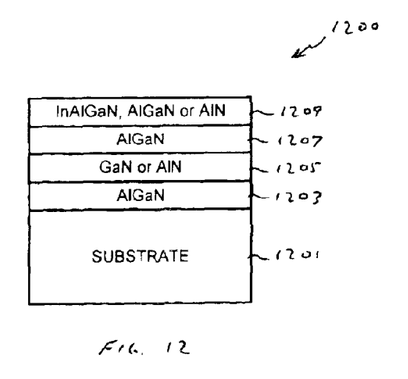
FIG. 12 illustrates a seventh exemplary structure fabricated in accordance with the invention.

Structure 1200 shown in FIG. 12 is comprised of a substrate 1201, a thin AlGaN layer 1203 (preferably on the order of 0.05 microns thick), a thick GaN or AlN layer 1205 (preferably between 2 and 100 microns thick), a thin AlGaN layer 1207 (preferably on the order of 0.2 microns thick), and a thin InAlGan, AlGaN, or AlN layer 12091107 (preferably on the order of 0.002 microns thick).

As will be understood by those familiar with the art, the present invention may be embodied in other specific forms without departing from the spirit or essential characteristics thereof. For example, other sources can be used such as boron (B), indium (In), arsenic (As) and phosphorous (P). These sources, in combination with the previously noted sources, allow the growth of GaN, AlGaN, AlN, InGaN, InGaAlN, InGaAlBNPAs, etc. Accordingly, the disclosures and descriptions herein are intended to be illustrative, but not limiting, of the scope of the invention which is set forth in the following claims.

What is claimed is:

1. A method of epitaxially growing a multi-layer device in a single epitaxial run utilizing HVPE techniques, the method comprising the steps of:

locating a first Group III source within an HVPE reactor;

locating a second Group III source within said HVPE reactor;

heating said first Group III source to a first temperature;

heating said second Group III source to a second temperature;

heating a first growth zone of said HVPE reactor to a third temperature;

heating a second growth zone of said HVPE reactor to a fourth temperature, wherein said first and second growth zones are different growth zones;

locating a substrate within said first growth zone;

reacting said first Group III source with a halide gas to form a first Group III reactant;

reacting said second Group III source with said halide gas to form a second Group III reactant;

transporting said first Group III reactant to said first growth zone;

transporting a reaction gas to said first growth zone, said reaction gas containing nitrogen;

reacting said first Group III reactant with said reaction gas to grow a first Group III nitride layer of a first thickness on said substrate;

transferring said substrate to said second growth zone, wherein a temperature corresponding to said substrate varies by less than 200° C. during the transferring step;

transporting said second Group III reactant to said second growth zone;

transporting said reaction gas to said second growth zone; and reacting said second Group III reactant with said reaction gas to grow a second Group III nitride layer of a second thickness on said first Group III nitride layer substrate.

2. The method of claim 1, further comprising the step of transferring said substrate to a growth interruption zone maintained at a fifth temperature prior to the step of transferring said substrate to said second growth zone.

3. The method of claim 2, further comprising the step of directing an inert gas in a flow direction that substantially prevents said first Group III reactant, said second Group III reactant, and said reaction gas from entering said growth interruption zone.

4. The method of claim I, further comprising the step of stabilizing the reaction between said second Group III reactant and said reaction gas prior to performing said step of transferring said substrate from said first growth zone to said second growth zone.

5. The method of claim 2, further comprising the step of stabilizing the reaction between said second Group III reactant and said reaction gas prior to transferring said substrate from said growth interruption zone to said second growth zone.

6. The method of claim 1, wherein the temperature corresponding to said substrate varies by less than 100° C. during the transferring step.

7. The method of claim 1, wherein the temperature corresponding to said substrate varies by less than 50° C. during the transferring step.

8. The method of claim 1, wherein the temperature corresponding to said substrate varies by less than 10° C. during the transferring step.

9. The method of claim 1, wherein the first thickness of said first Group III nitride layer is greater than 1 micron and the second thickness of said second Group III nitride layer is less than 1 micron.

10. The method of claim 1, wherein the first thickness of said first Group III nitride layer is greater than 2 microns and the second thickness of said second Group III nitride layer is less than 1 micron.

11. The method of claim 1, wherein the first thickness of said first Group III nitride layer is greater than 5 microns and the second thickness of said second Group III nitride layer is less than 1 micron.

12. The method of claim 3, wherein said flow direction of said inert gas is substantially orthogonal to a source flow direction.

13. The method of claim 3, wherein said flow direction of said inert gas is substantially opposite to a source flow direction.

14. The method of claim 3, wherein said flow direction of said inert gas is at an oblique angle to a growth surface of said substrate.

15. The method of claim 1, further comprising the steps of:

locating a third Group III source within said HYPE reactor;

heating said third Group III source to a fifth temperature;

reacting said third Group III source with said halide gas to form a third Group III reactant;

transporting said third Group III reactant to said first growth zone; and reacting said third Group III reactant with said reaction gas, wherein said first Group III nitride layer is comprised of both said first and third Group III sources.

16. The method of claim 15, further comprising the steps of:

locating a fourth Group III source within said HVPE reactor;

heating said fourth Group III source to a sixth temperature;

reacting said fourth Group III source with said halide gas to form a fourth Group III reactant;

transporting said fourth Group III reactant to said first growth zone; and reacting said fourth Group III reactant with said reaction gas, wherein said first Group III nitride layer is comprised of said first, third and fourth Group III sources.

17. The method of claim 1, further comprising the steps of:

locating a third Group III source within said HVPE reactor;

heating said third Group III source to a fifth temperature;

reacting said third Group III source with said halide gas to form a third Group III reactant;

transporting said third Group III reactant to said second growth zone; and reacting said third Group III reactant with said reaction gas, wherein said second Group III nitride layer is comprised of both said second and third Group III sources.

18. The method of claim 1, further comprising the steps of:

locating a fourth Group III source within said HVPE reactor;

heating said fourth Group III source to a sixth temperature;

reacting said fourth Group III source with said halide gas to form a fourth Group III reactant;

transporting said fourth Group III reactant to said second growth zone; and reacting said fourth Group III reactant with said reaction gas, wherein said second Group III nitride layer is comprised of said second, third and fourth Group III sources.

19. The method of claim 1, further comprising the step of growing a buffer layer on said substrate prior to said step of reacting said first Group III reactant with said reaction gas to grow a first Group III nitride layer.

20. The method of claim 19, wherein said buffer layer is comprised of a material selected from the group consisting of GaN, AlN, and aluminum oxy nitride.

21. The method of claim 1, further comprising the steps of:

heating at least one acceptor impurity metal to a fifth temperature; and transporting said at least one acceptor impurity metal to said first growth zone, wherein said first Group III nitride layer contains said at least one acceptor impurity metal.

22. The method of claim 21, wherein said first Group III nitride layer is a p-type layer.

23. The method of claim 21, wherein said at least one acceptor impurity metal is selected from the group consisting of magnesium (Mg), zinc (Zn) and magnesium-zinc (MgZn) alloys.

24. The method of claim 21, further comprising the step of lowering a temperature corresponding to said at least one acceptor impurity metal from said fifth temperature to a sixth temperature, wherein said lowering step is performed after initiation of growth of said first Group III nitride layer and prior to said step of transferring said substrate to said second growth zone.

25. The method of claim 24, wherein said sixth temperature is approximately 10° C. lower than said fifth temperature.

26. The method of claim 1, further comprising the steps of:

heating at least one acceptor impurity metal to a fifth temperature; and transporting said at least one acceptor impurity metal to said second growth zone, wherein said second Group III nitride layer contains said at least one acceptor impurity metal.

27. The method of claim 26, wherein said second Group III nitride layer is a p-type layer.

28. The method of claim 26, wherein said at least one acceptor impurity metal is selected from the group consisting of magnesium (Mg), zinc (Zn) and magnesium-zinc (MgZn) alloys.

29. The method of claim 26, further comprising the step of lowering a temperature corresponding to said at least one acceptor impurity metal from said fifth temperature to a sixth temperature, wherein said lowering step is performed after initiation of growth of said second Group III nitride layer.

30. The method of claim 29, wherein said sixth temperature is approximately 10° C. lower than said fifth temperature.

31. The method of claim 1, further comprising the step of transporting at least one donor impurity to said first growth zone, wherein said first Group III nitride layer contains said at least one donor impurity.

32. The method of claim 31, wherein said at least one donor impurity is selected from the group consisting of oxygen (O), germanium (Ge), silicon (Si) and tin (Sn).

33. The method of claim 1, further comprising the step of transporting at least one donor impurity to said second growth zone, wherein said second Group III nitride layer contains said at least one donor impurity.

34. The method of claim 33, wherein said at least one donor impurity is selected from the group consisting of oxygen (O), germanium (Ge), silicon (Si) and tin (Sn).

* * * * *